(12) United States Patent
Brandorff et al.

(10) Patent No.: US 6,756,797 B2
(45) Date of Patent: Jun. 29, 2004

(54) PLANARIZING INTERPOSER FOR THERMAL COMPENSATION OF A PROBE CARD

(75) Inventors: Alexander Brandorff, New Milford, CT (US); William P. Pardee, Redding, CT (US)

(73) Assignee: Wentworth Laboratories Inc., Brookfield, CT (US)

( * ) Notice: Subject to any disclaimer, the term of this patent is extended or adjusted under 35 U.S.C. 154(b) by 0 days.

(21) Appl. No.: 10/059,677

(22) Filed: Jan. 29, 2002

(65) Prior Publication Data

US 2002/0109514 A1 Aug. 15, 2002

Related U.S. Application Data

(60) Provisional application No. 60/265,357, filed on Jan. 31, 2001, and provisional application No. 60/265,708, filed on Feb. 1, 2001.

(51) Int. Cl.[7] .............................................. G01R 31/02
(52) U.S. Cl. ...................................... 324/754; 324/758
(58) Field of Search ................................. 324/754, 755, 324/757, 758, 765; 174/255, 256, 260, 261; 361/748, 760, 761, 762, 767, 769, 771; 439/65, 66

(56) References Cited

U.S. PATENT DOCUMENTS

| | | | |
|---|---|---|---|
| 3,930,809 A | 1/1976 | Evans | 29/203 J |
| 4,382,228 A | 5/1983 | Evans | 324/158 F |
| 4,599,559 A | 7/1986 | Evans | 324/158 P |
| 4,719,417 A | 1/1988 | Evans | 324/158 P |
| 4,975,638 A | 12/1990 | Evans et al. | 324/158 P |
| 5,355,079 A | 10/1994 | Evans et al. | 324/754 |
| 5,416,429 A | 5/1995 | McQuade et al. | 324/762 |
| 5,440,240 A | 8/1995 | Wood et al. | 324/765 |
| 5,539,324 A * | 7/1996 | Wood et al. | 324/758 |
| 5,623,213 A | 4/1997 | Liu et al. | 324/754 |
| 5,762,981 A | 6/1998 | Nitsche | 425/822 |
| 5,841,291 A | 11/1998 | Liu et al. | 324/755 |
| 5,952,840 A * | 9/1999 | Farnworth et al. | 324/755 |
| 5,959,461 A | 9/1999 | Brown et al. | 324/765 |
| 5,973,504 A | 10/1999 | Chong | 324/754 |
| 5,974,662 A | 11/1999 | Eldridge et al. | 29/842 |
| 6,031,383 A | 2/2000 | Streib et al. | 324/754 |
| 6,099,286 A | 8/2000 | Nitsche | 425/168 |
| 6,124,723 A | 9/2000 | Costello | 324/762 |
| 6,133,744 A | 10/2000 | Yojima et al. | 324/754 |
| 6,160,412 A | 12/2000 | Martel et al. | 324/761 |
| 6,163,162 A | 12/2000 | Thiessen et al. | 324/761 |
| 6,255,602 B1 | 7/2001 | Evans et al. | 174/262 |
| 6,264,476 B1 * | 7/2001 | Li et al. | 439/66 |
| 6,297,657 B1 | 10/2001 | Thiessen et al. | 324/761 |

OTHER PUBLICATIONS

Communication including PCT International Search Report from the US/ISA, dated Jun. 21, 2002.

* cited by examiner

Primary Examiner—Evan Pert
Assistant Examiner—Russell M Kobert
(74) Attorney, Agent, or Firm—William A. Simons; Michael K. Kinney; Wiggin and Dana LLP

(57) ABSTRACT

A probe card assembly that compensates for differing rates of thermal expansion is disclosed herein. The assembly is comprised of a multi-layered dielectric plate interposed between a probe head and a printed circuit board. The printed circuit board has arrayed upon its surface a first plurality of electrical contacts arranged in a pattern. The dielectric plate has a second plurality of electrical contacts arranged in a pattern matching the first plurality of contacts. A planarizing interposer is interposed between the plate and the printed circuit board and has a pattern of holes matching the pattern of electrical contacts on the printed circuit board and plate. The assembly further includes a plurality of electrical connectors disposed within each of the holes arrayed in a pattern upon the planarizing interposer a plurality conductive bumps or fuzz buttons making electrical contact with the first and second plurality of electrical contacts.

25 Claims, 4 Drawing Sheets

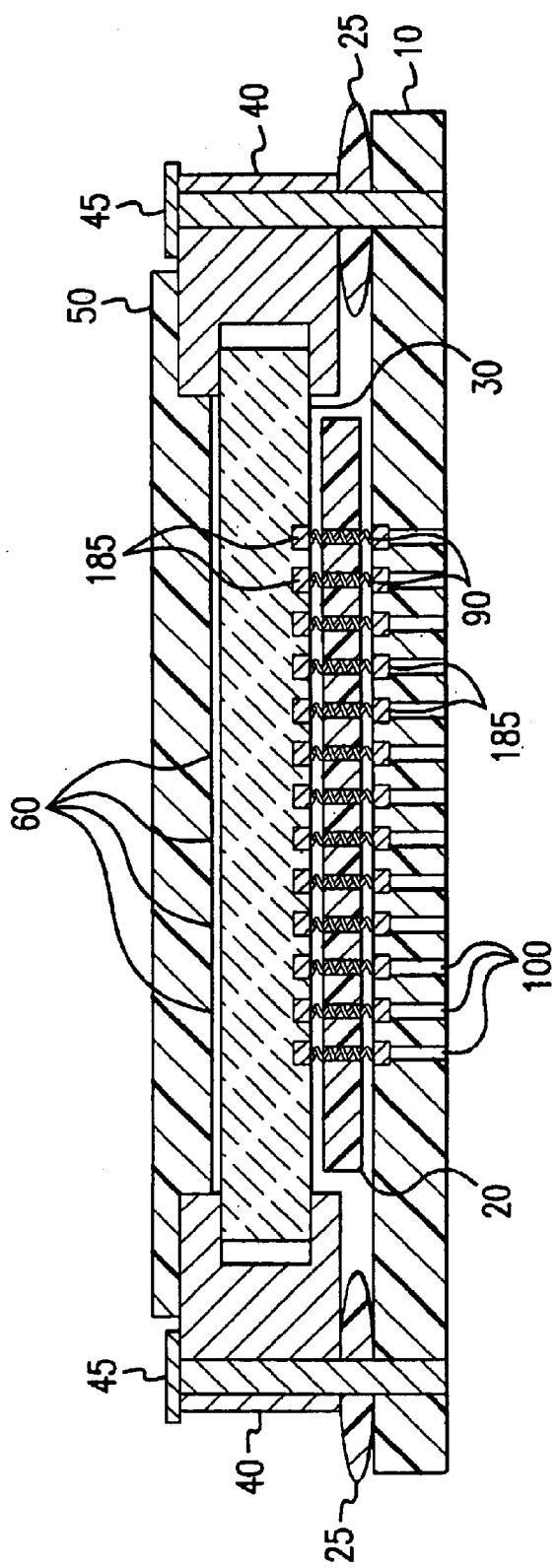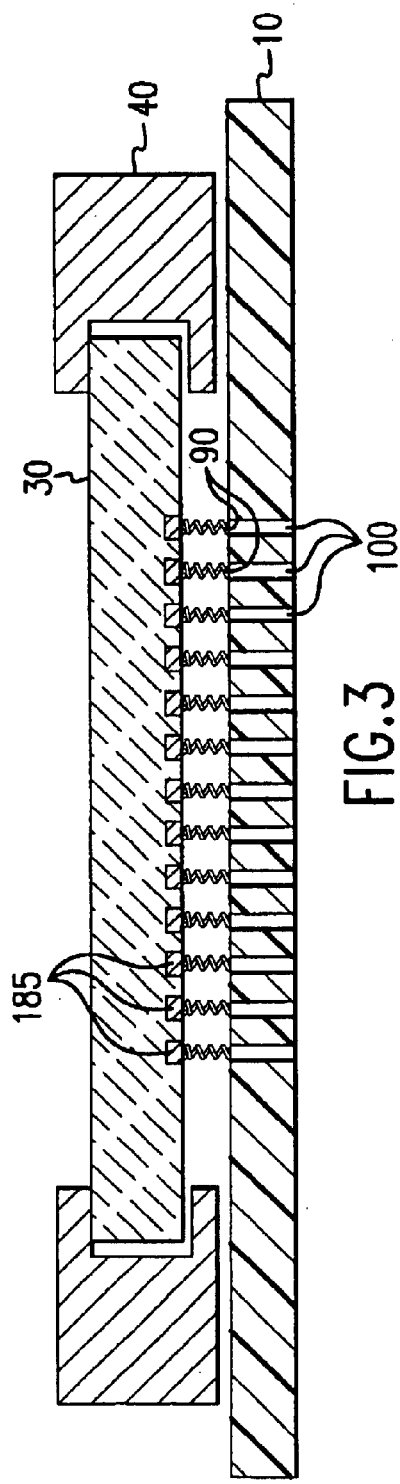

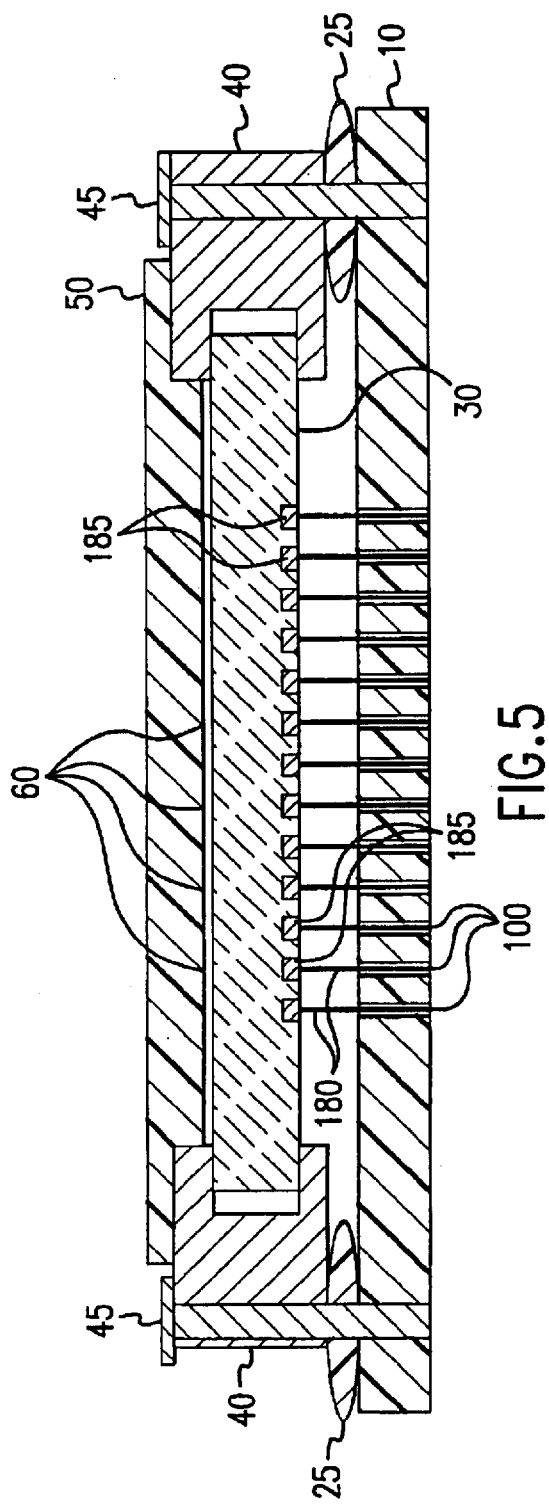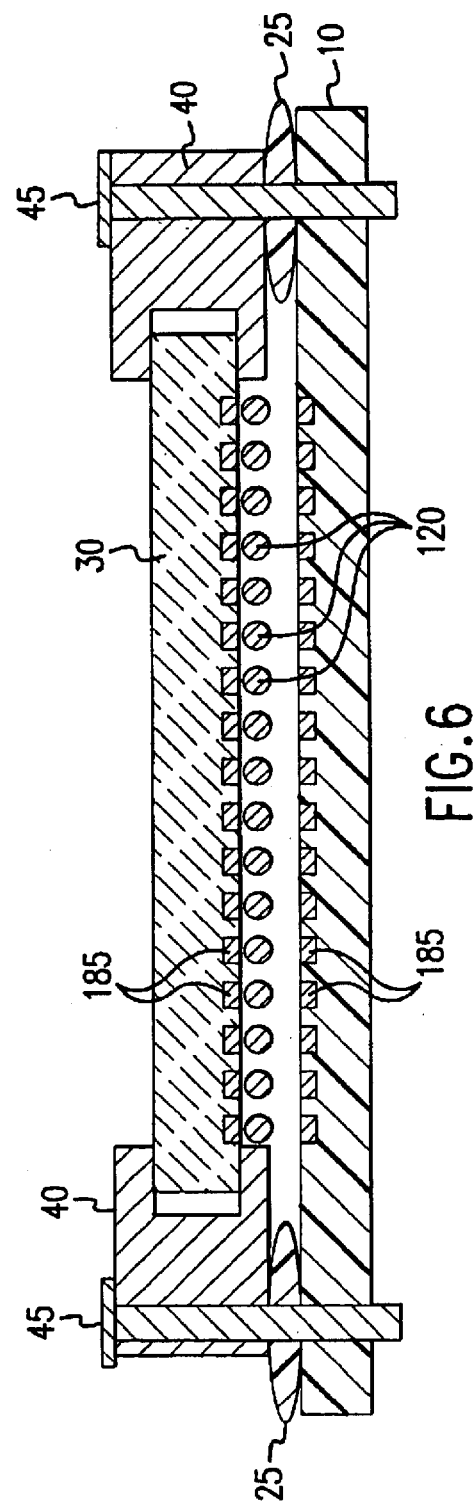

PLANARIZING INTERPOSER FOR THERMAL COMPENSATION OF A PROBE CARD

CROSS-REFERENCE TO RELATED APPLICATIONS

This patent application claims priority from U.S. Provisional Patent Application Serial No. 60/265,357 filed Jan. 31, 2001 and U.S. Provisional Patent Application Serial No. 60/265,708 filed Feb. 1, 2001, both of which are incorporated by reference herein in their entireties.

BACKGROUND OF THE INVENTION

This invention relates to the manufacture of probe card assemblies used to test the electrical continuity of integrated circuits formed on semiconductor wafers, such as silicon or gallium arsenide.

In the standard design of probe cards for performing such testing, a multi-layered ceramic (MLC) plate is inserted between a probe head that has a plurality of small diameter probes positioned to contact circuitry on an integrated circuit under test and a printed circuit board (PCB) that interfaces with an electric meter or other piece of test equipment. The plate is a space transformer having electrically conductive lines with conductive vias extending therethrough. The purpose of the MLC space transformer is to re-route electrical signals from the very finely pitched pattern of electrical contacts on the probe head to the more coarsely pitched pattern on the printed circuit board. By "pitched" it is meant that there exists spacing between adjacent lines or vias. In the process of testing an integrated circuit, electrical connection must be made between the MLC and the printed circuit board. Such a connection is typically achieved by soldering the MLC to the PCB using industry standard soldering techniques to form a rigid solder connection. When conducting such testing at elevated temperatures, for example between 75 degrees and 125 degrees Celsius, it is desirable to manufacture the probe head out of materials whose Coefficient of Thermal Expansion (CTE) closely matches that of silicon wafer being tested. The CTE of silicon is 3.2 ppm/degC. Accordingly, it is preferred that the CTE of the probe head be approximately 2 times that of silicon, such as less than 7 ppm/degC.

Because the MLC makes electrical contact with the finely pitched contacts on the probe head, it too must have a CTE closely matching that of silicon. Preferably, the CTE of the MLC is also within 2 times of the CTE of silicon. This requirement presents a problem when mating the MLC to the PCB, as the CTE of PCB is typically 17 ppm, much higher than that of silicon. Because of the differing rates of expansion between the MLC and the PCB, there is a potential for the rigid solder connections to crack under the mechanical stress that results from heating and/or cooling the structure.

Typically, all probes of the probe head must be planar within a tolerance of a few thousandths of an inch. Careful control of manufacturing and assembly tolerances, as well as additional grinding and polishing processes, are required to maintain such a degree of planarity.

Existing circuitry testing methods and apparatuses do not account for this difference of CTEs. For example U.S. Pat. No. 5,623,213 entitled "Membrane Probing of Circuits" and U.S. Pat. No. 5,841,291 entitled "Exchangeable Membrane Probe Testing of Circuits" are directed to the use of electrically conductive bumps on a flexible substrate or membrane to test electrical circuits. There is no suggestion or discussion that the system compensates for the differences of CTE inherent in the overall system.

Likewise, U.S. Pat. No. 5,973,504 entitled "Programmable High-Density Electronic Device Testing" is directed to a system for testing high-density electronic devices. More particularly, this patent discloses the use of a test system with a multi-chip module to route signals between pads of a device under test and a test circuit. This system employs a membrane probe card and conductive circuit connection bumps. The membrane probe card is screwed onto the housing using a frame ring and is positioned between a pressure mechanism and the device under test. The conductive bumps are grouped on the membrane to correspond with the connection pad arrays. In an alternative embodiment, electrical connection may be maintained using electrical button connectors. Again there is no suggestion that the system be designed to compensate for the differences of CTE inherent in the testing system.

U.S. Pat. No. 5,623,213 entitled "Membrane Probing of Circuits," U.S. Pat. No. 5,841,291 entitled "Exchangeable Membrane Probe Testing of Circuits," and U.S. Pat. No. 5,973,504 entitled "Programmable High-Density Electronic Device Testing" are incorporated by reference herein in their entireties.

Commonly owned U.S. Pat. Nos. 6,163,162 and 6,297,657, both entitled "Temperature Compensated Vertical Pin Probing Device," are directed to improved probing devices useful in testing integrated circuits over large temperature ranges. Both of these patents disclose methods and apparatuses complementary to the method and apparatus disclosed herein. U.S. Pat. Nos. 6,163,162 and 6,297,657 are incorporated by reference herein in their entireties.

Accordingly, there is a need for a method and apparatus useful to adjust the planarity of the probe head after assembly in order to correct for misalignment. Ideally, such a method and apparatus should minimize the need for critical machining and assembly processes.

BRIEF SUMMARY OF THE INVENTION

It is an object of the invention to find a method of electrically and mechanically connecting the MLC to the PCB in a way that will allow for the differing rates of expansion while maintaining electrical contact.

Additionally, it is an object of the invention to provide a process whereby one may adjust the planarization of the MLC relative to the PCB.

One novel aspect of the present invention involves the attachment of the MLC to the PCB in a manner that allows for differing rates of thermal expansion as well as allowing for probe head planarization, while maintaining electrical contact between the MLC and the PCB.

To compensate for the differing rates of thermal expansion, the present invention suitably employs a planarizing interposer that includes a plate positioned between the MLC and the PCB while maintaining a compliant electrical connection. For the purposes of this disclosure, "compliant electrical connection" shall refer to a connection that maintains electrical connection and the integrity of the components on either side of the interconnection regardless of differing rates of thermal expansion, and allows for planarization of the head assembly. Compliant electrical connection with the device under test (integrated circuit) may be maintained using fuzz buttons or conductive bumps. In embodiments where fuzz buttons are used, the plate has a plurality of holes (also called vias or via holes) drilled in a pattern that matches the pattern of electrical contacts on the PCB. Fuzz buttons are then positioned within the holes. In embodiments where conductive bumps are employed, the conductive bumps are screened or deposited onto land grid array pads of the MLC and/or the PCB.

In a first embodiment, there is disclosed a probe card assembly for testing integrated circuits comprising: a multi-layered dielectric plate interposed between a probe head and a printed circuit board, the printed circuit board having arrayed upon its surface a first plurality of electrical contacts arranged in a pattern, the dielectric plate having arrayed upon its surface a second plurality of electrical contacts arranged in a pattern substantially matching the first plurality of electrical contacts; a planarizing interposer interposed between the ceramic plate and the printed circuit board, the planarizing interposer having a pattern of holes matching the pattern of electrical contacts on the printed circuit board and the dielectric plate; a mounting ring clamped to the plate and the mounting ring attached to the printed circuit board; and a third plurality of compliant electrical connectors disposed within a multiplicity of the holes arrayed in a pattern upon the planarizing interposer, the electrical connectors making electrical contact with the first plurality of electrical contacts and the second plurality of electrical contacts.

In a second embodiment, there is disclosed a method of adjusting the planarization of a probe card assembly comprising the steps of: (a) screwing the adjustment screws sufficiently tightly so as render the mounting ring in close proximity with the printed circuit board; (b) determining the planarization of said probe head; and (c) adjusting the tightness of the screws to achieve a desired degree of planarization for the probe head.

In a third embodiment, there is disclosed a method of assembling a probe card assembly comprising the steps of: (a) inserting each of a plurality of fuzz buttons into via holes using an electrically conductive tool; and (b) confirming electrical connectivity between the multi-layered dielectric plate and the printed circuit board.

In a fourth embodiment, there is disclosed a method of assembling the probe card assembly of claim 1, comprising the steps of: (a) providing a temporary plate to verify electrical connection; and (b) replacing the temporary plate with a multi-layered dielectric prior to testing.

BRIEF DESCRIPTION OF THE DRAWINGS

FIG. 2 is a cross-sectional representation of the probe card assembly.

FIG. 3 is a cross-sectional representation of the probe card assembly depicting the use of fuzz buttons.

FIG. 5 is a cross-sectional representation of the probe card assembly depicting the use of conductive bumps between the PCB and the space transformer.

FIG. 6 is a cross-sectional representation of the probe card assembly depicting the use of conductive bumps between the PCB and MLC.

DETAILED DESCRIPTION

The present invention includes a planarizing interposer located between a MLC or other multi-layered dielectric and a PCB. The interposer uses a compliant interconnect (generally shown in FIG. 1), such as fuzz buttons (illustrated in FIGS. 2, 3, and 4), a Pin Grid Array (illustrated in FIG. 5), or conductive bumps (illustrated in FIG. 6), to maintain electrical connection between the PCB and the MLC. Throughout this specification reference to a MLC is intended to also include other suitable multi-layered dielectric plates.

Figure 1:
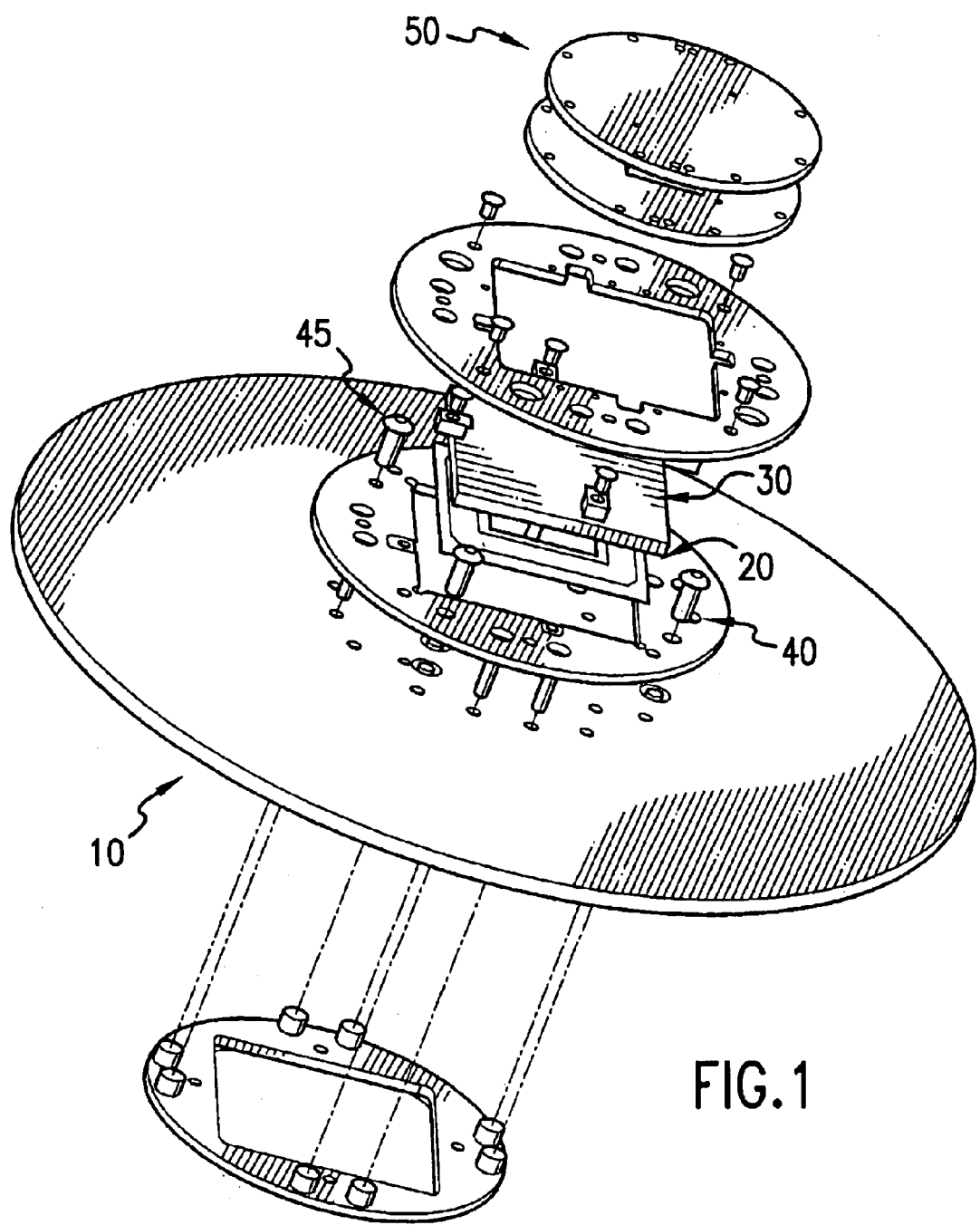
FIG. 1 is a schematic diagram of the probe card assembly according to the present invention.

Turning to FIG. 1, an interposer 20 includes a plate with a plurality of through-holes formed in a pattern that matches the pattern of a first plurality of electrical contacts on the PCB 10. Preferably, the plate is formed of a dielectric, such as rigid plastic. Most preferably, the plate is formed of Techtron PPS manufactured by Quadrant Engineering Plastic Products. The first plurality of electrical contacts are typically arranged in an array with pitch of 0.05 inches. While 0.05 inches is typical, one skilled in the art would recognize that other pitches may be suitably employed. Electrical connectors are deposited in the through-holes to provide an electrical pathway. A preferred electrical connector is that of a small cylindrically shaped element called a fuzz button. The fuzz button is a commercial product consisting of a thin electrically conductive metal wire, such as beryllium copper, that has been compressed into a die to form a cylindrical mass and having spring-like properties. Examples of preferred fuzz buttons include those manufactured by Tecknit of Cranford, N.J.

The MLC 30 may be clamped to a mounting ring 40, which is then attached to the PCB 10 in a manner, as described below, that allows the ring's planarization to be adjusted. The mounting ring 40 is mounted to the PCB 10 using a plurality of screws 45. A preferred configuration employs three screws. On each screw, between the ring 40 and the PCB 10, are placed stiff springs 25, as shown in FIG. 2. Suitable stiff springs include spring washers, such as Belleville washers manufactured by HK Metalcraft Inc. of Lodi, N.J. Most preferably, the screws 45 pass through the mounting ring 40 and spring washer 25, such that turning the screws allows the planarity of the mounting ring to be adjusted. The MLC 30 may optionally rest on a shelf 55 in the mounting ring 40. Preferably, the MLC 30 is clamped onto the shelf in the ring.

Preferably, the mounting ring 40 is attached so that the MLC 30 is in close proximity with the surface of the PCB 10. The resulting compression causes the MLC 30 to be held in the ring against the fuzz buttons 90 (as shown in FIG. 2) in the interposer 20. As a result, the fuzz buttons make electrical connection between the MLC 30 and the PCB 10. Since the electrical connection is not rigid, the PCB 10 is free to expand at a different rate than the MLC 30 while continuing to make electrical contact. A probe head (also called a test head) 50 (shown in FIG. 2) can now be placed in a tester that determines the degree of planarization of the probe head 50. If adjustment is necessary, the appropriate adjusting screw 45 may be unscrewed slightly so as to level the probe head 50. The Belleville washers 25 are selected to provide sufficient pre-load between the ring 40 and the PCB 10 so as to ensure that the ring does not move under the normal loads applied during the probe test process. As shown in FIG. 2, optional pads 185 may be deposited or brazed onto the MLC 30 or PCB 10

In an alternative embodiment, as shown in FIG. 3, the PCB 10 has hollow plated vias or via holes 100. Fuzz buttons 90 are inserted in the via holes 100. Preferably, the fuzz buttons 90 have diameters slightly larger than the vias 100 so that the fuzz buttons 90 are held in place by compression. For example, the via holes 100 may be approximately 0.03 inches in diameter and the fuzz buttons 90 slightly larger. In this embodiment, no interposer (shown in FIG. 2 as numeral 20) is required, saving a significant portion of the cost of the interposer 20, and eliminating the need for alignment of the frame to the PCB 10. Accordingly, because alignment is inherently ensured, this embodiment has improved reliability.

Preferably, the fuzz buttons 90 are inserted from the non-test side 160 of the PCB 10 and are pushed through until an electrical contact is verified between the fuzz button 90 and the MLC 30. The non-test side refers to the side of the board opposite the test head 50. Such a configuration ensures that the final height of all the fuzz buttons 90 relative to the MLC 30 are nearly the same. To simplify the assembly process, it may be desirable to temporarily use an aluminum plate in place of the MLC. Use of such a plate simplifies the verification of an electrical connection. Preferably, a tool that is electrically conductive is used to push the fuzz buttons 90 through the vias 100, so that contact may be verified when there is a closed electrical path from the tool, through the fuzz button 90 to a temporary plate and back to the tool. This temporary plate (not shown) temporarily replaces the MLC 30 for purposes of loading the fuzz buttons 90 and is removed and replaced with the MLC 30. It may be desirable to make the temporary plate slightly thicker than the actual MLC 30, such that the fuzz buttons 90 are compressed against the temporary plate. Removing the plate and replacing it with the MLC 30 then allows the fuzz buttons 90 to relax slightly while maintaining electrical contact, thereby minimizing the compressive force exerted on the MLC 30.

This configuration ensures the alignment of the fuzz buttons 90 relative to the PCB 10. To further simplify the alignment of the MLC 30 to the fuzz buttons 90, additional pads 185 may be optionally employed to the MLC's contact array (not shown) on the side of the MLC opposite the test head 50. The pattern of the MLC contact array matches the LGA pattern on the PCB 10. Two corresponding holes in the PCB 10 may be used to sight through the PCB 10 to the pads. The MLC 30 may then be adjusted so as to center the pads in the hole. A preferred arrangement includes two alignment pins, such as those used in pin grid array MLC's, that are brazed to the pads. These pads pass through two corresponding additional via holes in the PCB 10, thereby aligning the MLC's LGA array to the PCB's via array.

In an alternative embodiment (not shown), the stiff Belleville washers 25 may be eliminated or replaced with lower-stiffness washers, and the planarizing screws 45 may be counter-sunk into the mounting ring. In this alternative embodiment, the ring may be free to float relative to the PCB 10 and self-planarize during testing, while the counter-sunk screws suitably re-center the ring when the test load is removed. The degree of float between the ring and the PCB is compensated by the compliant electrical contacts (fuzz buttons or conductive bumps).

Figure 3A:
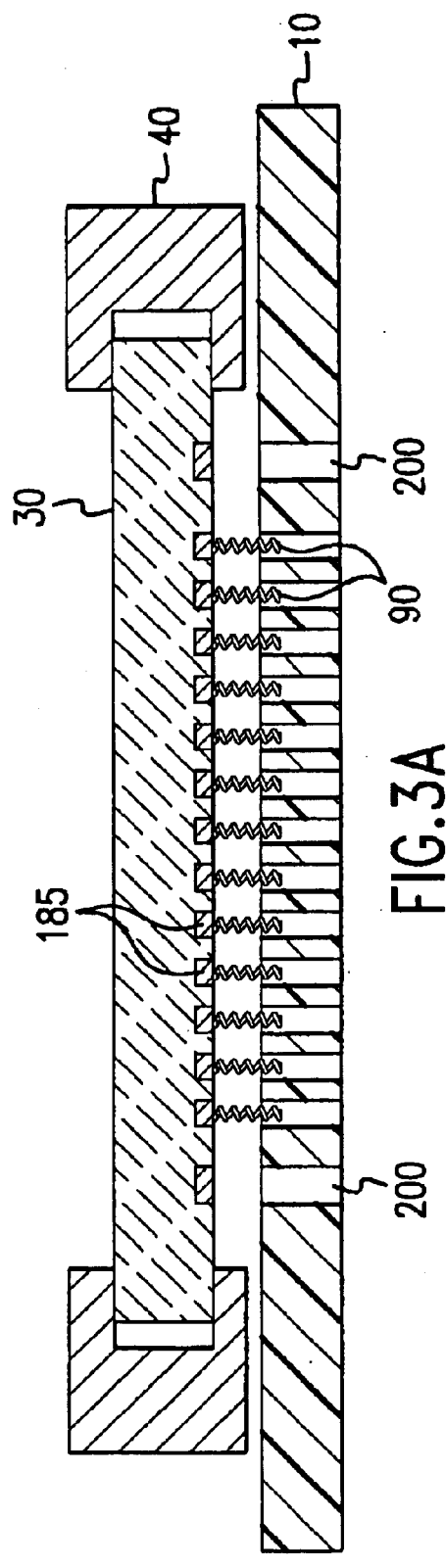
FIG. 3a is a cross-section representation of the probe card assembly with through holes in the PCB for alignment purposes.

FIG. 3a depicts the use of site holes 200 to assist in the alignment of the assembly.

Figure 4:
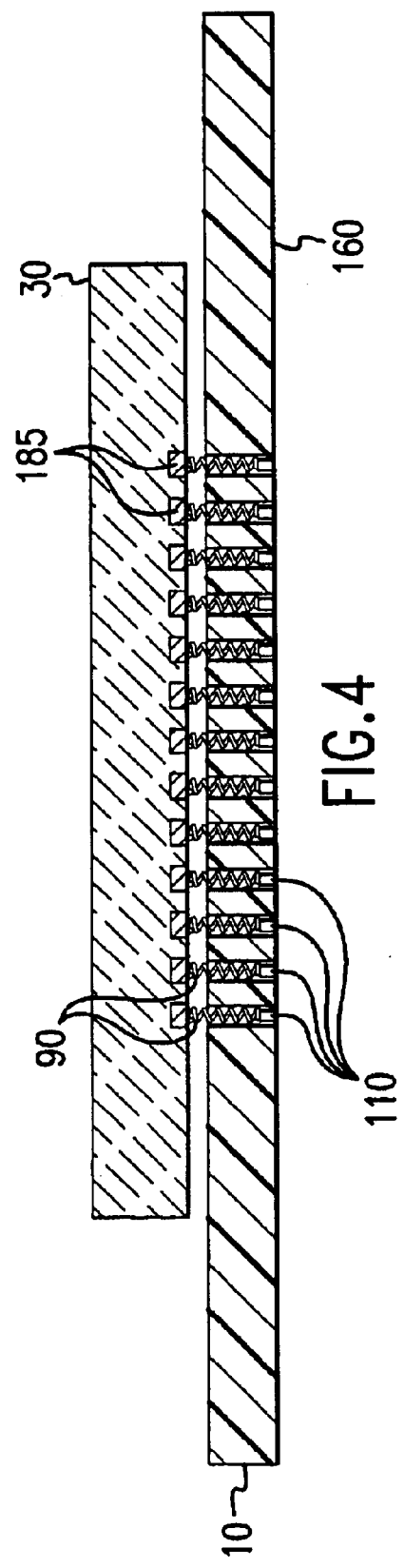
FIG. 4 is a cross-sectional representation of the probe card assembly depicting the use of fuzz buttons with filled via holes.

In another embodiment, as shown in FIG. 4, longer and softer fuzz buttons may be used with a plurality of blind vias 110. In this embodiment, the non-test end 160 of the vias 110 are filled such that the depth of the vias allow a portion of the fuzz buttons to protrude beyond the PCB 10. In this embodiment, the diameter of the vias 110 may be larger than that of the fuzz buttons 90 as friction is no longer preferred to maintain the fuzz buttons 90 position.

In an alternate embodiment, as shown in FIG. 5, an interposer 20 is constructed using a Pin Grid Array (PGA) 180 brazed to the contact pads of the MLC 30. The PGA mates with and is inserted into plated vias in the PCB. Spring washers 25 (such as Belleville washers) are placed under the mounting ring 40 at a plurality of locations, preferably three. Adjustment screws 45 (also shown in FIG. 1) pass through the washers 25 to allow the planarity of the ring to be adjusted. Once properly planarized, the tips of the PGA, which protrude through the back side (non-test side) of the PCB, are soldered to the back side of the PCB vias 100. Optionally, to shorten the electrical path of the pins 180, a conductive paste, such as a conductive epoxy or solder, may be injected or screened into the vias on the test head side of the board. Preferably, the inside diameters of the vias are larger than the pins so that when the pins are inserted into the vias, the paste fills the space between the pins and the vias to create an electrical connection. Such a configuration shortens the electrical path so that shorter pins may be used. The MLC 30 may then be aligned using the method set forth above. Because an electrical connection has been created between the MLC 30 and the PCB 10, the test head may be mounted to the mounting ring and MLC 30, and a final planarity check may be done with the completed assembly. If necessary, the planarity may be adjusted. Once properly aligned, the assembly is cured, such as by a low temperature cure cycle, to set the conductive paste. Once planarity is verified, an epoxy filler may be injected under the MLC 30 to fill the gap between the MLC 30 and the PCB 10, increasing the bond strength between the MLC 30 and the PCB 10.

In an alternative embodiment as shown in FIG. 6, fuzz buttons 90 may be replaced with compliant conductive bumps 120. These conductive bumps 120, preferably made of conductive epoxy, such as a metal or graphite polymer with an electrical resistivity less than 0.005 ohm-cm, are screened or deposited onto land grid array pads of the MLC 30 and/or the PCB 10. When the MLC 30 and PCB 10 are brought into contact, the bumps 120 form a compliant electrical path between the MLC 30 and the PCB 10. The test head (not shown) is then mounted to the mounting ring 40 and aligned with the MLC 30. The test head's planarity is then tested to ensure proper planarity and adjusted, if necessary, by turning the adjustment screw 45 (of FIG. 1) to bring the high side of the head closer to the PCB 10. The PCB 10 and space transformer 130 are then heated until the epoxy is cured, so that the space transformer 130 is held to the PCB 10. An epoxy under-filler is then injected under the MLC 30.

Optionally, the conductive bumps may be made of a solder paste preferably using a low melting point solder, such as 100 degC. Preferably, the solder is solid at room temperature. As the temperature rises during testing, the solder softens and re-flows, eliminating mechanical stress while maintaining electrical contact. When cooled, the solder re-solidifies.

Thus, there has been shown and described an apparatus and method to planarize a probe card assembly prior to testing. One skilled in the art would recognize that other embodiments and modifications may be useful without detracting from the overall purpose of this invention. Any such modifications and applications recognized by one skilled in the art is intended to fall within the scope of this application.

What is claimed is:

1. A probe card assembly for testing integrated circuits comprising:

a multi-layered dielectric plate interposed between a probe head and a printed circuit board said printed circuit board having arrayed upon its surface a first plurality of electrical contacts arranged in a pattern, said dielectric plate having arrayed upon its surface a second plurality of electrical contacts arranged in a pattern substantially matching said first plurality of electrical contacts;

a planarizing interposer interposed between said dielectric plate and said printed circuit board said planarizing interposer having a pattern of holes matching the pattern of electrical contacts on said printed circuit board and said dielectric plate;

a mounting ring clamped to said plate and said mounting ring attached to said printed circuit board; and a third plurality of compliant electrical connectors disposed within a multiplicity of said holes arrayed in a pattern upon said planarizing interposer said electrical connectors making electrical contact with said first plurality of electrical contacts and said second plurality of electrical contacts.

2. The probe card assembly of claim 1, wherein said mounting ring is attached to said printed circuit board with a plurality of screws.

3. The probe card assembly of claim 2, wherein a washer is interposed between each of said plurality of screws and said printed circuit board.

4. The probe card assembly of claim 3, wherein each of said washer is a spring washer.

5. The probe card assembly of claim 4, wherein said electrical contacts are arranged in array having a pitch of approximately 0.05 inches.

6. The probe card assembly of claim 4, wherein said third plurality of compliant electrical connectors is comprised of a plurality of fuzz buttons.

7. The probe card assembly of claim 6, wherein said printed circuit board includes one or more via holes.

8. The probe card assembly of claim 7 wherein the plurality of fuzz buttons are inserted into said via holes.

9. A method of assembling the probe card assembly of claim 8, comprising the steps of:

(a) inserting each of said plurality of fuzz buttons into said via holes using an electrically conductive tool; and (b) confirming electrical connectivity between said multi-layered dielectric plate and said printed circuit board.

10. The method of claim 9 wherein the printed circuit board has a non-test side from which said fuzz buttons are inserted.

11. The probe card assembly of claim 8, wherein said plurality of fuzz buttons have diameters larger than the diameters of said via holes.

12. A method of adjusting the planarization of a probe card assembly of claim 4 comprising the steps of:

(a) screwing said screws sufficiently tightly so as render said mounting ring in close proximity with said printed circuit board;

(b) determining the planarization of said probe head; and (c) adjusting the tightness of said screws to achieve a desired degree of planarization for said probe head.

13. The method of claim 12 wherein said mounting ring floats relative to the printed circuit board.

14. The method of claim 13 wherein said screws are counter-sunk and further comprising the step of re-centering the mounting ring during testing using said counter-sunk screws.

15. The probe card assembly of claim 2, wherein said plurality of screws are counter-sunk into said mounting ring.

16. A method of assembling the probe card assembly of claim 1, comprising the steps of:

(a) providing a temporary plate to verify electrical connection; and (b) replacing said temporary plate with said multi-layered dielectric plate prior to testing.

17. A probe card assembly for testing integrated circuits comprising:

a multi-layered dielectric plate interposed between a probe head and a printed circuit board said printed circuit board having arrayed upon its surface a first plurality of electrical contacts arranged in a pattern, said dielectric plate having arrayed upon its surface a second plurality of electrical contacts arranged in a pattern substantially matching said first plurality of electrical contacts;

a mounting ring clamped to said plate and said mounting ring attached to said printed circuit board;

a third plurality of compliant electrical connectors arranged in a pattern corresponding to said first plurality of electrical contacts and said second plurality of electrical contacts, said third plurality of compliant electrical connectors making electrical contact with said first plurality of electrical contacts and said second plurality of electrical contacts; and wherein the printed circuit board includes one or more blind via holes.

18. The probe card assembly of claim 17 wherein said third plurality of buttons are inserted into said blind via holes.

19. The probe card assembly of claim 18 wherein said fuzz buttons are inserted so as to protrude above the printed circuit board toward said multi-layered dielectric plate.

20. The probe card assembly of claim 17, wherein said third plurality of compliant electrical connectors is comprised of a plurality of conductive bumps that are screened onto said first plurality of electrical contacts.

21. The probe card assembly of claim 17, wherein said third plurality of compliant electrical connectors is comprised of a plurality of conductive bumps that are deposited onto said first plurality of electrical contacts.

22. The probe card assembly of claim 21, wherein said conductive bumps consist of solder paste.

23. The probe card assembly of claim 22, wherein said solder paste has a low melting point.

24. The probe card assembly of claim 23, wherein said solder paste has a melting point less than or equal to 100° C.

25. The probe card assembly of claim 17, wherein said third plurality of compliant electrical connectors is comprised of a pin grid array brazed to said first plurality of electrical contacts.

* * * * *